United States Patent
Song

(10) Patent No.: US 11,163,007 B2
(45) Date of Patent: Nov. 2, 2021

(54) CURRENT DETECTION CIRCUIT, BATTERY MANAGEMENT SYSTEM, AND BATTERY PACK

(71) Applicant: LG Chem, Ltd., Seoul (KR)

(72) Inventor: Hyeon-Jin Song, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/765,672

(22) PCT Filed: Aug. 5, 2019

(86) PCT No.: PCT/KR2019/009745
§ 371 (c)(1),
(2) Date: May 20, 2020

(87) PCT Pub. No.: WO2020/032514
PCT Pub. Date: Feb. 13, 2020

(65) Prior Publication Data
US 2020/0300919 A1    Sep. 24, 2020

(30) Foreign Application Priority Data

Aug. 10, 2018   (KR) .................. 10-2018-0093867

(51) Int. Cl.
*G01R 31/28* (2006.01)
*H01M 10/48* (2006.01)
(Continued)

(52) U.S. Cl.
CPC ....... *G01R 31/382* (2019.01); *G01R 31/2829* (2013.01); *H01M 10/48* (2013.01); *H02J 7/005* (2020.01); *H02J 7/0048* (2020.01)

(58) Field of Classification Search
USPC ... 324/207.13–207.15, 200, 86, 167, 207.25, 324/426, 654, 76.75, 76.11, 500, 750.16,
(Continued)

(56) References Cited

U.S. PATENT DOCUMENTS

2006/0082357 A1* 4/2006 Tsukamoto ............ G01R 15/20
324/126
2006/0158176 A1   7/2006 Preusse et al.
(Continued)

FOREIGN PATENT DOCUMENTS

| CN | 107942251 A | 4/2018 |
|---|---|---|
| JP | 2004087851 A | 3/2004 |

(Continued)

OTHER PUBLICATIONS

International Search Report for Application No. PCT/KR2019/009745, dated Nov. 26, 2019, pp. 1-2.
(Continued)

*Primary Examiner* — Melissa J Koval
*Assistant Examiner* — Trung Q Nguyen
(74) *Attorney, Agent, or Firm* — Lerner, David, Littenberg, Krumholz & Mentlik, LLP

(57) ABSTRACT

A current detection circuit to detect an electric current of the battery pack includes an insulating substrate, a first busbar and a second busbar disposed on a first surface of the insulating substrate, a shunt resistor disposed between the first busbar and the second busbar on the first surface, and electrically connected to the first busbar and the second busbar, and a hall effect sensor disposed on a second surface of the insulating substrate, wherein the second surface is opposite the first surface.

12 Claims, 7 Drawing Sheets

(51) Int. Cl.
*H02J 7/00* (2006.01)
*G01R 31/382* (2019.01)

(58) Field of Classification Search
USPC ........ 324/220; 702/35, 58, 64, 65, 113–114, 702/185
See application file for complete search history.

(56) References Cited

U.S. PATENT DOCUMENTS

| | | |
|---|---|---|
| 2007/0290701 A1 | 12/2007 | Nguyen |
| 2013/0314827 A1 | 11/2013 | Sohn |
| 2014/0210479 A1 | 7/2014 | Rink et al. |
| 2014/0333314 A1 | 11/2014 | Kaupp |
| 2016/0116507 A1* | 4/2016 | Mosser ................ G01R 22/061 324/117 H |
| 2017/0261536 A1 | 9/2017 | Chae et al. |
| 2018/0113153 A1 | 4/2018 | Jang et al. |
| 2019/0004094 A1 | 1/2019 | Park et al. |
| 2019/0120906 A1 | 4/2019 | Dan et al. |

FOREIGN PATENT DOCUMENTS

| | | |
|---|---|---|
| JP | 2009276359 A | 11/2009 |
| JP | 2012042409 A | 3/2012 |
| JP | 2018025446 A | 2/2018 |
| KR | 20090008162 U | 8/2009 |
| KR | 20150058897 A | 5/2015 |
| KR | 20150124358 A | 11/2015 |
| KR | 101663579 B1 | 10/2016 |
| KR | 101687384 B1 | 12/2016 |
| KR | 20170124406 A | 11/2017 |
| KR | 20180013466 A | 2/2018 |
| KR | 20180044725 A | 5/2018 |

OTHER PUBLICATIONS

Extended European Search Report for Application No. 19847419.9, dated Feb. 17, 2021, 6 pages.

* cited by examiner

CURRENT DETECTION CIRCUIT, BATTERY MANAGEMENT SYSTEM, AND BATTERY PACK

CROSS-REFERENCE TO RELATED APPLICATIONS

The present application is a national phase entry under 35 U.S.C. § 371 of International Application No. PCT/KR2019/009745 filed Aug. 5, 2019, published in Korean, which claims priority from Korean Patent Application No. 10-2018-0093867 filed Aug. 10, 2018, all of which are incorporated herein by reference.

TECHNICAL FIELD

The present disclosure relates to a current detection circuit for detecting an electric current of a battery pack, a battery management system and a battery pack.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A current detection circuit is installed on a high current path of a battery pack to output a signal or data indicating the charging/discharging current flowing through the battery to a battery management system. The charging/discharging current is a basic and important parameter essentially required to calculate the state of charge (SOC) and the state of health (SOH) of the battery. Accordingly, it is necessary to measure the charging/discharging current as accurately as possible.

In general, the current detection circuit has a shunt resistor. The battery management system may detect the charging/discharging current by dividing a potential difference between two terminals of the shunt resistor when the charging/discharging current flows through the shunt resistor by a resistance of the shunt resistor. However, because the shunt resistor has very high sensitivity, a large error may occur in some instances. Patent Literature 1 is designed to solve the problem. Patent Literature 1 discloses an apparatus and method for detecting the charging/discharging current using a shunt resistor as well as a hall device (also known as a hall effect sensor).

However, the current detection circuit including both the shunt resistor and the hall device needs a wider space than the current detection circuit including either the shunt resistor or the hall device.

(Patent Literature 1) Korean Patent Publication No. 10-2015-0058897 (published on May 29, 2015)

SUMMARY

Technical Problem

The present disclosure is designed to solve the above-described problem, and therefore the present disclosure is directed to providing a current detection circuit with improved spatial utilization in which a shunt resistor and a hall effect sensor are disposed on two surfaces of an insulating substrate in a distributed manner such that the shunt resistor is disposed on one surface of the insulating substrate and the hall effect sensor is disposed on the other surface, a battery management system and a battery pack.

These and other objects and advantages of the present disclosure may be understood by the following description and will be apparent from the embodiments of the present disclosure. Additionally, it will be readily understood that the objects and advantages of the present disclosure may be realized by the means set forth in the appended claims and their combination.

Technical Solution

A current detection circuit according to an aspect of the present disclosure includes is provided to detect an electric current of a battery pack. The current detection circuit includes an insulating substrate, a first busbar and a second busbar disposed on a first surface of the insulating substrate, a shunt resistor disposed between the first busbar and the second busbar on the first surface, and electrically connected to the first busbar and the second busbar, and a hall effect sensor disposed on a second surface of the insulating substrate. The second surface is opposite the first surface.

The current detection circuit may further include a third busbar and a fourth busbar disposed on the first surface. The first busbar may be electrically connected to a first connection pin of a first switching device disposed on the second surface of the insulating substrate. The third busbar may be electrically connected to a second connection pin of the first switching device. The second busbar may be electrically connected to a third connection pin of a second switching device disposed on the second surface of the insulating substrate. The fourth busbar may be electrically connected to a fourth connection pin of the second switching device.

The hall effect sensor may be disposed between the first switching device and the second switching device.

The insulating substrate may include a first via hole, a second via hole, a third via hole and a fourth via hole, each of the via holes passing through the insulating substrate between the first surface and the second surface. The first busbar and the first connection pin may be electrically connected to each other through the first via hole. The second busbar and the third connection pin may be electrically connected to each other through the second via hole. The third busbar and the second connection pin may be electrically connected to each other through the third via hole. The fourth busbar and the fourth connection pin may be electrically connected to each other through the fourth via hole.

Widthwise centers of each of the first busbar, the second busbar, the shunt resistor and the hall effect sensor may be aligned each other.

The current detection circuit may further include a magnetic shield partially surrounding the hall effect sensor.

The insulating substrate may further include a first opening and a second opening, each opening passing through the insulating substrate between the first surface and the second surface. Respective portions of the magnetic shield may pass through the insulating substrate from the first surface to the second surface through the first opening and the second opening, respectively.

The magnetic shield may include a base and a pair of legs bent from opposing sides of the base and extending so that the pair of legs face each other.

A direction of a widthwise center of the shunt resistor may be aligned with a direction of a widthwise center of the hall effect sensor.

The insulating substrate may include a first conductive pattern electrically connected to a control pin of the first switching device, and a second conductive pattern electrically connected to a control pin of the second switching device.

A battery management system according to another aspect of the present disclosure includes the current detection circuit, and a control unit configured to receive a first current signal from the shunt resistor and a second current signal from the hall effect sensor.

The control unit may be configured to determine whether the current detection circuit is faulty based on the first current signal and the second current signal, and output a diagnosis signal indicating a result of the determination.

A battery pack according to still another aspect of the present disclosure includes the battery management system.

Advantageous Effects

According to at least one of the embodiments of the present disclosure, it is possible to improve the spatial utilization by arranging the shunt resistor and the hall effect sensor on two surfaces of the insulating substrate in a distributed manner such that the shunt resistor is disposed on one surface of the insulating substrate and the hall effect sensor is disposed on the other surface.

In addition, it is possible to detect the charging/discharging current with higher reliability by placing the hall effect sensor between the two switching devices used to control the charging/discharging current.

The effects of the present disclosure are not limited to the effects mentioned above, and other effects will be clearly understood by those skilled in the art from the appended claims.

DETAILED DESCRIPTION

Figure 1:
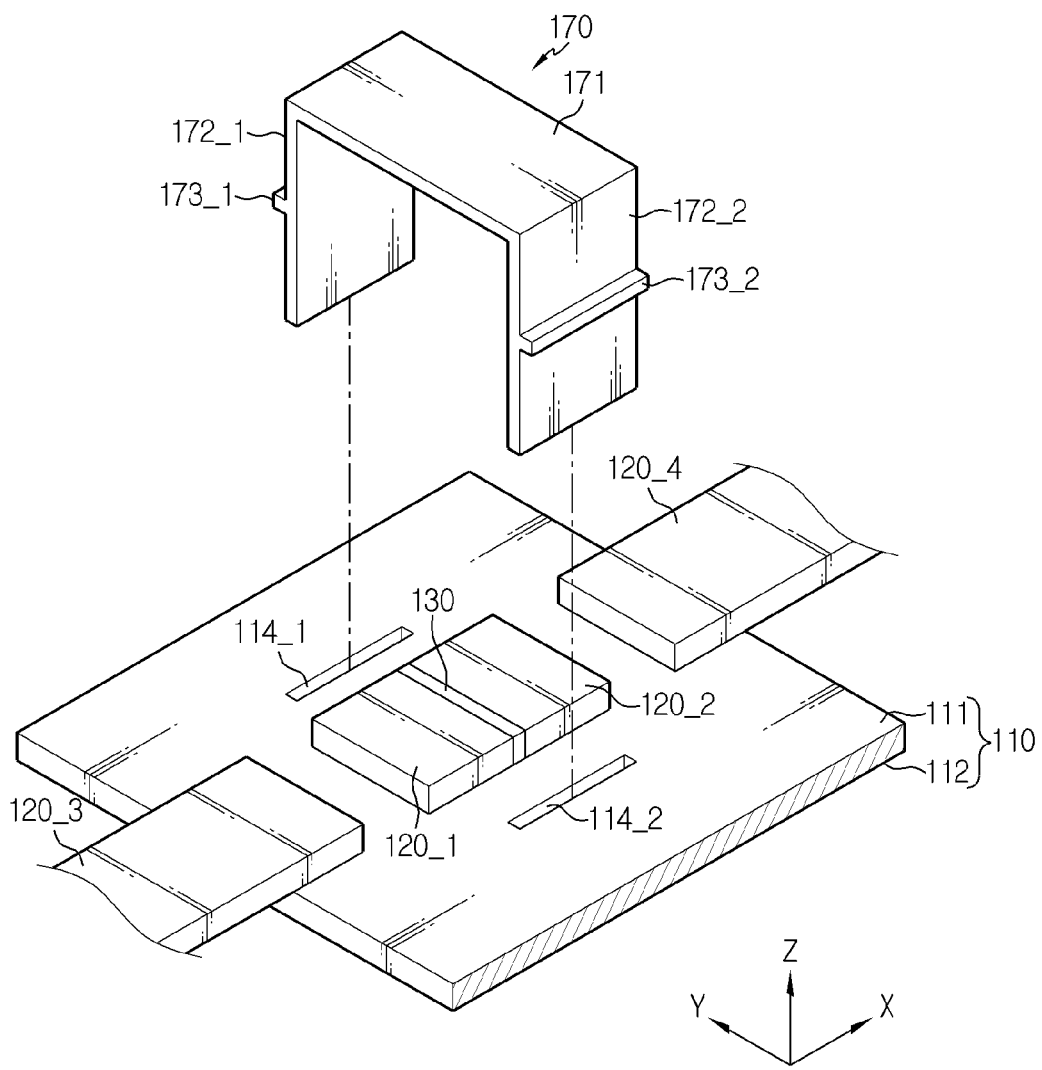
FIG. 1 is a perspective view of a current detection circuit according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general or dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure and do not fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Furthermore, the term <control unit>' as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 2:
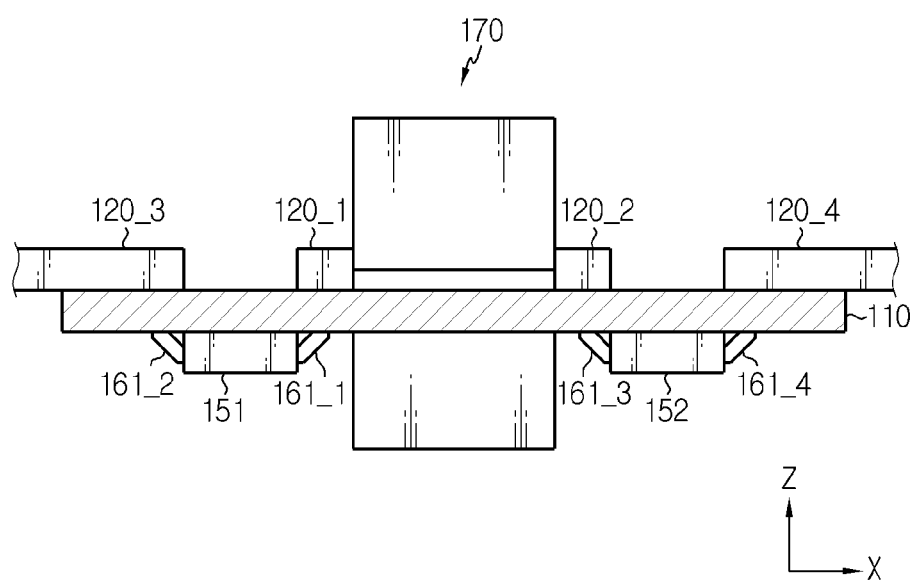
FIG. 2 is a side view of the current detection circuit shown in FIG. 1.
Figure 3:
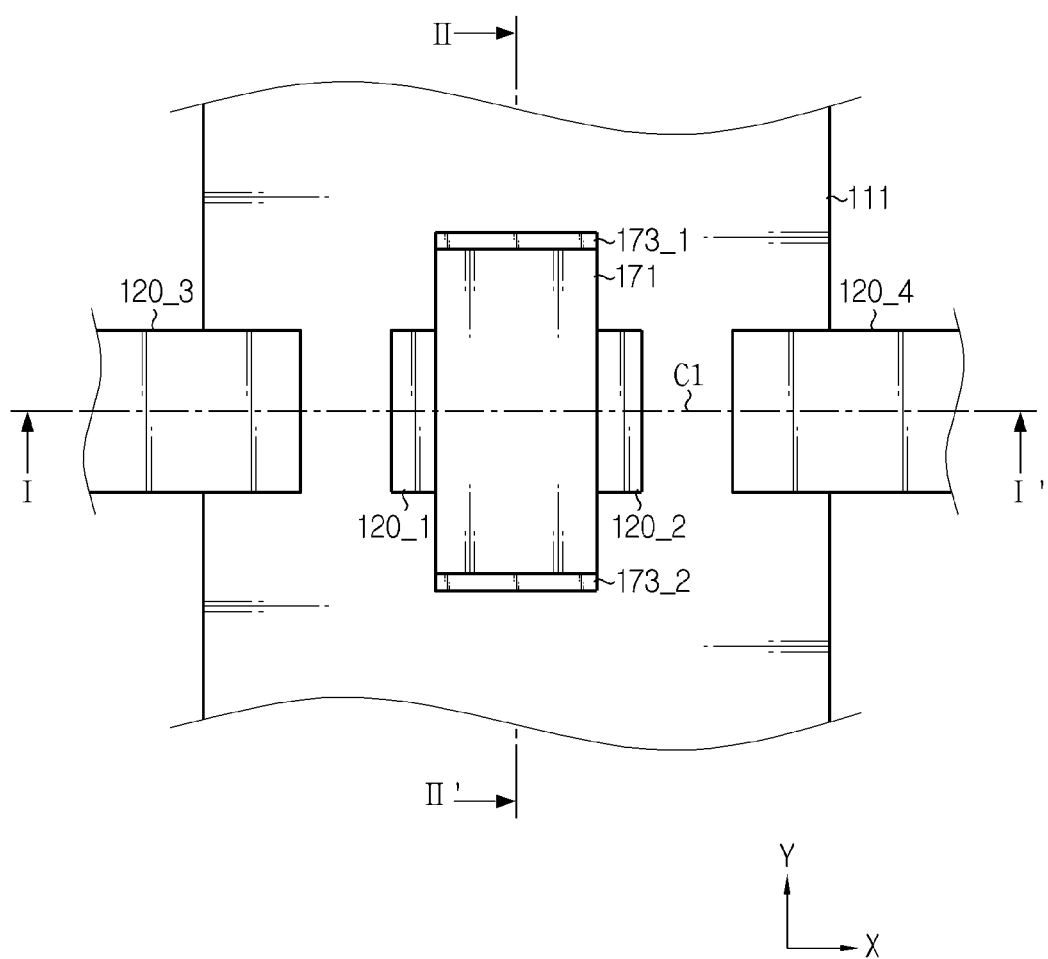
FIG. 3 is a front view of the current detection circuit shown in FIG. 1.
Figure 4:
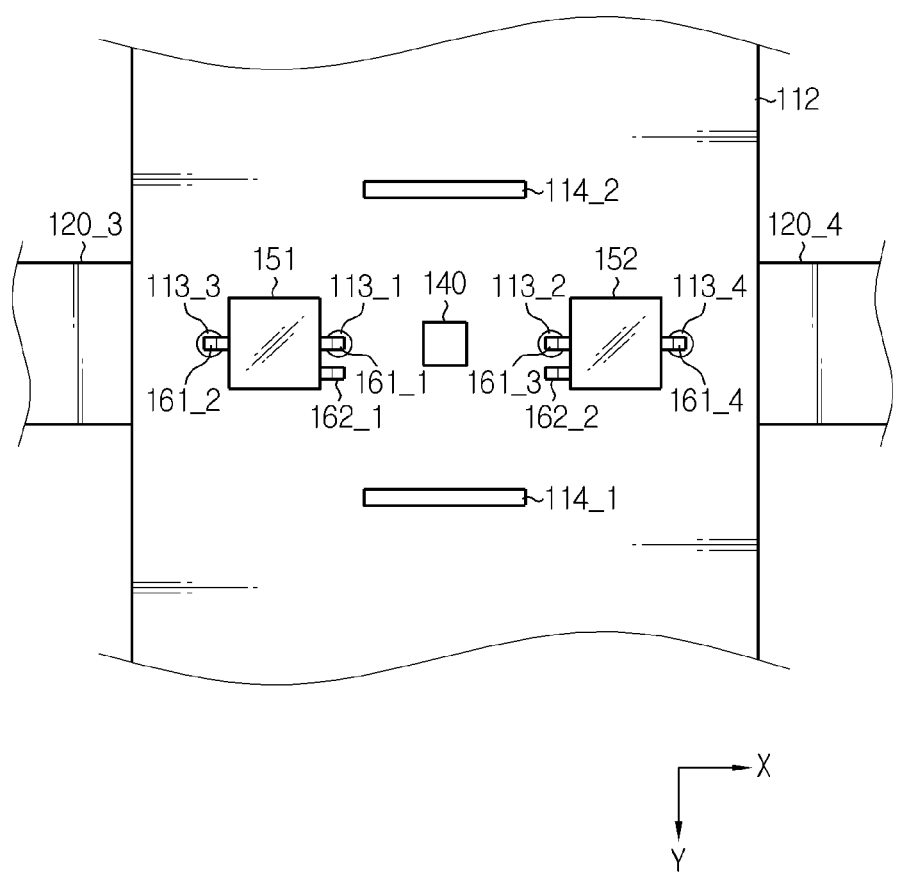
FIG. 4 is a rear view of the current detection circuit shown in FIG. 1.
Figure 5:
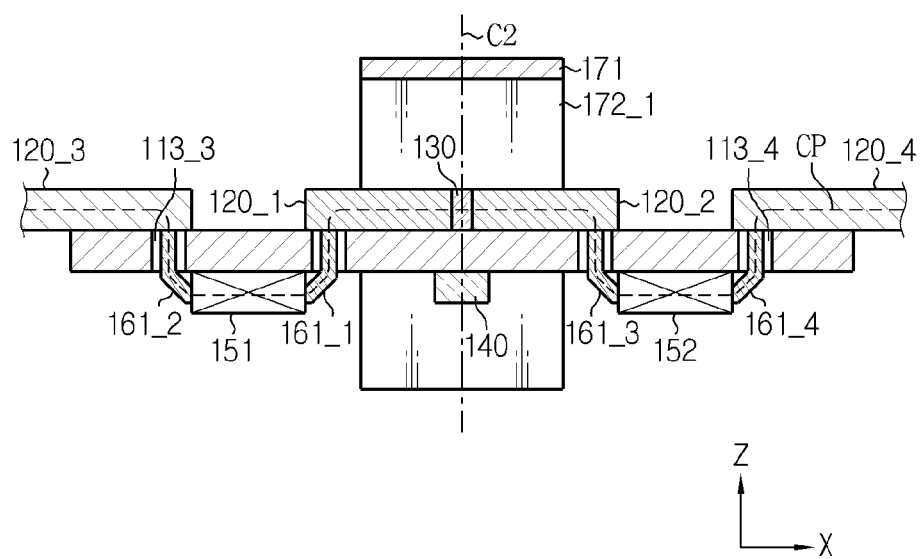
FIG. 5 is a cross-sectional view of the current detection circuit shown in FIG. 3, taken along the line I-I'.
Figure 6:
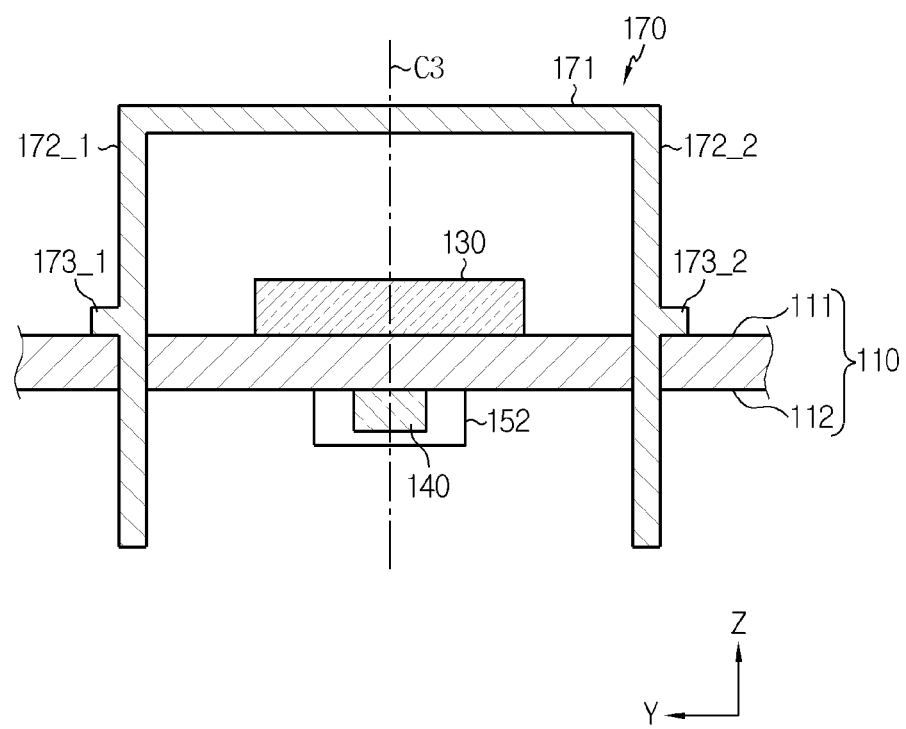
FIG. 6 is a cross-sectional view of the current detection circuit shown in FIG. 3, taken along the line II-II'.

FIG. 1 is a perspective view of a current detection circuit 100 according to an embodiment of the present disclosure, FIG. 2 is a side view of the current detection circuit 100 shown in FIG. 1, FIG. 3 is a front view of the current detection circuit 100 shown in FIG. 1, FIG. 4 is a rear view of the current detection circuit 100 shown in FIG. 1, FIG. 5 is a cross-sectional view of the current detection circuit 100 shown in FIG. 3, taken along the line I-I', and FIG. 6 is a cross-sectional view of the current detection circuit 100 shown in FIG. 3, taken along the line II-II'. For convenience of description, the X axis is defined as indicating a lengthwise direction, the Y axis as indicating a widthwise direction, and the Z axis as indicating a heightwise direction.

Referring to FIGS. 1 to 6, the current detection circuit 100 includes an insulating substrate 110, a busbar 120_1, a busbar 120_2, a shunt resistor 130 and a hall effect sensor 140. The current detection circuit 100 may include at least one of a busbar 120_3, a busbar 120_4 and a magnetic shield 170. Each of the busbar 120_1, the busbar 120_2, the shunt resistor 130, the busbar 120_3 and the busbar 120_4 forms part of a high current path (11 in FIG. 7) of a battery pack (10 in FIG. 7).

At least part of the insulating substrate 110 is in the shape of a flat plate. The insulating substrate 110 has a first surface 111 and a second surface 112 in which the busbar 120_1, the busbar 120_2, the shunt resistor 130 and the hall effect sensor 140 can be seated. The second surface 112 (e.g., a lower surface) is opposed to the first surface 111 (e.g., an upper surface). The insulating substrate 110 is physically coupled to the busbar 120_1, the busbar 120_2, the shunt resistor 130 and the hall effect sensor 140 by welding, etc., and support the busbar 120_1, the busbar 120_2, the shunt resistor 130 and the hall effect sensor 140 respectively. Each of the busbar 120_1, the busbar 120_2, the shunt resistor 130 and the hall effect sensor 140 is disposed at physically separated locations on the insulating substrate 110.

Each of the busbar 120_1 and the busbar 120_2 includes a conductive metal material (e.g., copper, aluminum). The busbar 120_1 and the busbar 120_2 may be disposed on the first surface 111 of the insulating substrate 110. At least one of length, width, height and shape of the busbar 120_1 and the busbar 120_2 may be the same or different.

Figure 7:
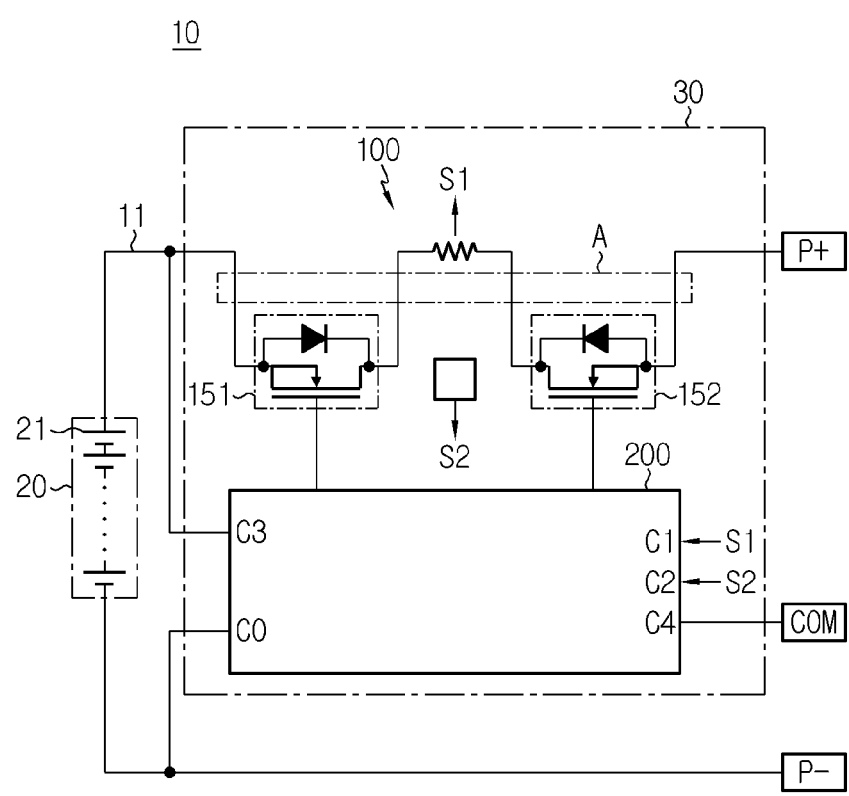
FIG. 7 is a schematic diagram of a battery pack including the current detection circuit shown in FIGS. 1 to 6.

The shunt resistor 130 has a temperature-dependent intrinsic resistance value, and accordingly, when the charging/discharging current flows, a voltage applied across the shunt resistor 130 is generated as a first current signal (S1 in FIG. 7). The shunt resistor 130 may be disposed on the first surface 111 of the insulating substrate 110. The shunt resistor 130 may include a metal material, and may be in the shape of a strip. To reduce the influence of temperature changes, it is desirable to manufacture the shunt resistor 130 including a material (e.g., constantan, manganin) having a resistivity-temperature coefficient that is as small as possible.

When the current flows through the busbar 120_1, the shunt resistor 130 and the busbar 120_2, magnetic fields surrounding each of the busbar 120_1, the shunt resistor 130 and the busbar 120_2 are generated.

The hall effect sensor 140 may be disposed on the second surface 112 of the insulating substrate 110. In response to the magnetic field generated when the current flows through the busbar 120_1, the shunt resistor 130 and the busbar 120_2, the hall effect sensor 140 generates a voltage corresponding to the intensity of the magnetic field as a second current signal (S2 in FIG. 7).

The busbar 120_3 includes a conductive metal material (e.g., copper, aluminum). One end of the busbar 120_3 may be disposed on the first surface 111 of the insulating substrate 110. The other end of the busbar 120_3 may be electrically connected to other part inside the battery pack 10 (e.g., a positive electrode terminal of the battery).

The busbar 120_4 includes a conductive metal material (e.g., copper, aluminum). In the same way as the busbar 120_3, one end of the busbar 120_4 may be disposed on the first surface 111 of the insulating substrate 110. The other end of the busbar 120_4 may be electrically connected to other part inside the battery pack 10 (e.g., a power terminal of the battery pack 10).

As shown in FIG. 3, the busbar 120_3, the busbar 120_1, the busbar 120_2 and the busbar 120_4 may be disposed on the first surface 111 of the insulating substrate 110 in that order along the X axis direction. In this case, the widthwise direction center of each of the busbar 120_1, the busbar 120_2, the busbar 120_3, the busbar 120_4 and the shunt resistor 130 may match each other. For example, the centerline of each of the busbar 120_1, the busbar 120_2, the busbar 120_3, the busbar 120_4 and the shunt resistor 130 may match a line indicated by C1 shown in FIG. 3.

The magnetic shield 170 has a U-shaped cross section, partially surrounding the hall effect sensor 140. As shown, the magnetic shield 170 is provided to shield two sides of the hall effect sensor 140 and part of the first surface 111 of the insulating substrate 110 from an external magnetic field.

The shunt resistor 130 is disposed between the busbar 120_1 and the busbar 120_2, and is electrically connected to the busbar 120_1 and the busbar 120_2. For example, one end of the shunt resistor 130 may be physically coupled to one end of the busbar 120_1, and the other end of the shunt resistor 130 may be physically coupled to one end of the busbar 120_2 through welding, etc.

Meanwhile, the lengthwise direction center of the hall effect sensor 140 may match the lengthwise direction center of the shunt resistor 130. The symbol C2 shown in FIG. 5 is a line indicating the lengthwise direction center of the hall effect sensor 140.

Each of the switching device (151 in FIG. 7) and the switching device (152 in FIG. 7) included in the battery pack (10 in FIG. 7) may be disposed on the second surface 112 of the insulating substrate 110. The widthwise direction center of the hall effect sensor 140 may match the widthwise direction center of the shunt resistor 130. The widthwise direction center of the hall effect sensor 140 may match the widthwise direction center of the switching device 151 and the switching device 152. In FIG. 6, the symbol C3 is a line indicating the widthwise direction center of the hall effect sensor 140, and to help an understanding, the connection pin 161_3 and the control pin 162_2 are omitted herein.

The insulating substrate 110 may have a plurality of via holes 113_1, 113_2, 113_3, 113_4. Each of the plurality of via holes 113_1, 113_2, 113_3, 113_4 refers to a portion passing through the insulating substrate 110 between the first surface 111 and the second surface 112 of the insulating substrate 110. Each of the plurality of via holes 113_1, 113_2, 113_3, 113_4 may be filled with a conductive material.

The via hole 113_1 mediates an electrical connection between the connection pin 161_1 of the switching device 151 and the busbar 120_1. That is, the connection pin 161_1 of the switching device 151 and the busbar 120_1 are electrically connected to each other through the via hole 113_1.

The via hole 113_2 mediates an electrical connection between the connection pin 161_3 of the switching device 152 and the busbar 120_2. That is, the connection pin 161_3 of the switching device 152 and the busbar 120_2 are electrically connected to each other through the via hole 113_2.

The via hole 113_3 mediates an electrical connection between the connection pin 161_2 of the switching device 151 and the busbar 120_3. That is, the connection pin 161_2 of the switching device 151 and the busbar 120_3 are electrically connected to each other through the via hole 113_3.

The via hole 113_4 mediates an electrical connection between the connection pin 161_4 of the switching device 152 and the busbar 120_4. That is, the connection pin 161_4 of the switching device 152 and the busbar 120_4 are electrically connected to each other through the via hole 113_4.

The hall effect sensor 140 may be disposed between the switching device 151 and the switching device 152. As described above, a current path CP within the current detection circuit 100 is not simply formed on only the first surface 111 of the insulating substrate 110, and instead, is formed on both the first surface 111 and the second surface 112. Accordingly, even though the current of the same magnitude flows through the current path CP, the intensity of the magnetic field detected by the hall effect sensor 140 disposed on the second surface 112 is higher.

The insulating substrate 110 includes a pair of openings 114_1, 114_2. The pair of openings 114_1, 114_2 is open between the first surface 111 and the second surface 112 of the insulating substrate 110. Parts of the magnetic shield 170 may be inserted into the insulating substrate 110 from the first surface 111 to the second surface 112 through the pair of openings 114_1, 114_2. In detail, the magnetic shield 170 includes a base 171 and a pair of legs 172_1, 172_2. The pair of legs 172_1, 172_2 may be bent from two sides of the base 171, and may extend so that they face each other. The busbar 120_1, the shunt resistor 130, the busbar 120_2 and the hall effect sensor 140 may be disposed in an area between the pair of openings 114_1, 114_2. The pair of legs 172_1, 172_2 may be inserted into the insulating substrate 110 along the Z axis direction through the pair of openings 114_1, 114_2. In this case, the Z axis distance between the ends of the pair of legs 172_1, 172_2 and the second surface 112 may be longer than the height of the hall effect sensor 140.

The magnetic shield 170 may further include at least one stopper 173. For example, as shown in FIGS. 1 and 6, when the magnetic shield 170 includes two stoppers 173_1, 173_2, the stopper 173_1 may protrude in the Y axis direction from a preset location of the leg 172_1, and the stopper 173_2 may protrude in the Y axis direction from a preset location of the leg 172_2. The pair of stoppers 173_1, 173_2 may come into contact with the first surface 111 of the insulating substrate 110 when the pair of legs 172_1, 172_2 is inserted into the insulating substrate 110 through the pair of openings 114_1, 114_2 along the Y axis direction. Accordingly, it is possible to prevent the magnetic shield 170 from moving due to external impacts, and shield two sides of the hall effect sensor 140 from external magnetic fields by the pair of legs 172_1, 172_2.

FIG. 7 is a schematic diagram of the battery pack 10 including the current detection circuit 100 shown in FIGS. 1 to 6.

Referring to FIGS. 1 to 7, the battery pack 10 includes a battery module 20, a battery management system 30, power terminals P+, P− and a communication port COM.

The battery module 20 includes at least one battery cell 21. When the battery module 20 includes a plurality of battery cells 21, each battery cell 21 may be connected to other battery cell 21 in series or in parallel. Each battery cell 21 may be, for example, a lithium ion battery. Of course, the type of the battery cell 21 is not limited to a lithium ion battery, and includes any type of battery cell that can be repeatedly recharged, without limitation.

The battery management system 30 includes a switching device 151, a switching device 152, a current detection circuit 100 and a control unit 200.

Each of the switching device 151, the switching device 152 and the current detection circuit 100 is installed on the high current path 11.

The switching device 151 includes a connection pin 161_1, a connection pin 161_2 and a control pin 162_1. The connection pin 161_1 is electrically connected to the busbar 120_1. The connection pin 161_2 may be electrically connected to the busbar 120_3. The switching device 151 is configured to control the charging current of the battery pack 10, and may be implemented using, for example, a field effect transistor. When a field effect transistor is used for the switching device 151, the connection pin 161_1 may be a drain (or a source), the connection pin 161_2 may be a source (or a drain), and the control pin 162_1 may be a gate.

The switching device 152 includes a connection pin 161_3, a connection pin 161_4 and a control pin 162_2. The connection pin 161_3 is electrically connected to the busbar 120_2. The connection pin 161_4 may be electrically connected to the busbar 120_4. The switching device 152 is configured to control the discharging current of the battery pack 10, and may be implemented using, for example, a field effect transistor. When a field effect transistor is used for the switching device 152, the connection pin 161_3 may be a drain (or a source), the connection pin 161_4 may be a source (or a drain), and the control pin 162_2 may be a gate.

As opposed to FIG. 7, the locations of the switching device 151 and the switching device 152 may be exchanged.

The insulating substrate 110 may be disposed within an area A shown in FIG. 7. Because the busbars 120_1, 120_2, 120_3, 120_4 and the shunt resistor 130 are disposed on the first surface 111 of the insulating substrate 110, and the switching device 151 and the switching device 152 are disposed on the second surface 112 of the insulating substrate 110, the current path (CP in FIG. 5) within the current detection circuit 100 is formed over the first surface 111 and the second surface 112.

The control pin 162_1 of the switching device 151 and the control pin 162_2 of the switching device 152 are connected to the control unit 200. A high level voltage (e.g., 5 V) selectively outputted from the control unit 200 is applied to the control pin 162_1 of the switching device 151 and the control pin 162_2 of the switching device 152. Each of the switching device 151 and the switching device 152 may operate in an on state while the high level voltage is outputted from the control unit 200, and operate in an off state while the output of the high level voltage from the control unit 200 is stopped.

The switching device 151 may further include a parasitic diode. The parasitic diode of the switching device 151 is connected between the connection pin 161_1 and the connection pin 161_2 of the switching device 151. While the switching device 151 has an off state, the charging current is interrupted by the parasitic diode of the switching device 151.

The switching device 152 may further include a parasitic diode. The parasitic diode of the switching device 152 is connected between the connection pin 161_3 and the connection pin 161_4 of the switching device 152. While the switching device 152 has an off state, the discharging current is interrupted by the parasitic diode of the switching device 152.

The control unit 200 may be implemented, in hardware, including at least one of application specific integrated circuits (ASICs), digital signal processors (DSPs), digital signal processing devices (DSPDs), programmable logic devices (PLDs), field programmable gate arrays (FPGAs), microprocessors, and electrical units for performing other functions. Additionally, a memory device may be embedded in the control unit 200, and the memory device may include, for example, RAM, ROM, register, hard disk, an optical recording medium or a magnetic recording medium. The memory device may store, update and/or erase programs including various types of control logics that are executed by the control unit 200, and/or data created when the control logics are executed. The control unit 200 is operably coupled to the switching device 151, the switching device 152 and the current detection circuit 100. The control unit 200 may be fixed and disposed on the second surface 112 of the insulating substrate 110.

The control unit 200 is configured to selectively change the switching device 151 and the switching device 152 from an on state to an off state or from the off state to the on state. In detail, the control unit 200 selectively controls each of the switching device 151 and the switching device 152 into an on state by individually applying the high level voltage to the control pin 162_1 of the switching device 151 and the control pin 162_2 of the switching device 152.

In an example, in a normal mode in which the high level voltage is applied to both the control pin 162_1 of the switching device 151 and the control pin 162_2 of the switching device 152, both the switching device 151 and the switching device 152 have the on state, allowing the charging current and the discharging current to flow through the high current path.

In another example, in a charge mode in which the high level voltage is applied to only the control pin 162_1 of the switching device 151, the switching device 151 has an on state and the switching device 152 has an off state, and thus the discharging current may be interrupted and only the charging current may flow through the high current path.

On the contrary, in a discharge mode in which the high level voltage is applied to only the control pin 162_2 of the switching device 152, the switching device 151 has an off state and the switching device 152 has an on state, and thus the charging current may be interrupted and only the discharging current may flow through the high current path.

The insulating substrate 110 may include first and second conductive patterns (not shown). The first conductive pattern is for an electrical connection between the control unit 200 and the control pin 162_1, and may be formed on the second surface 112 and electrically connected to the control pin 162_1. The second conductive pattern is for an electrical connection between the control unit 200 and the control pin 162_2, and may be formed on the second surface 112 and electrically connected to the control pin 162_2.

The control unit 200 has a reference terminal C0, a current sensing terminal C1, a current sensing terminal C2, a voltage sensing terminal C3 and a communication terminal C4. The reference terminal C0 may be electrically connected to a negative electrode terminal of the battery module 20.

The control unit 200 may keep monitoring the charging/discharging current based on the first current signal S1 from the current detection circuit 100 received through the current sensing terminal C1. The control unit 200 may keep monitoring the charging/discharging current based on the second current signal S2 from the current detection circuit 100 received through the current sensing terminal C2. The control unit 200 may determine each of a current value of the charging/discharging current represented by the first current signal S1 and a current value of the charging/discharging current represented by the second current signal S2, and when a difference between the two current values is equal to or more than a predetermined threshold, determine that the current detection circuit 100 is faulty.

The control unit 200 may keep monitoring the voltage of the battery module 20 based on a difference between a voltage applied onto the reference terminal C0 and a voltage applied onto the voltage sensing terminal C3.

The control unit 200 determines whether a failure exists in at least one of the battery module 20, the switching device 151, the switching device 152 and the current detection circuit 100 based on at least one of the charging/discharging current represented by the first current signal S1, the charging/discharging current represented by the second current signal S2 and the voltage of the battery module 20, and outputs a diagnosis signal indicating a result of the determination onto the communication terminal C4. The diagnosis signal may be transmitted to an external device through the communication port COM connected to the communication terminal C4.

The communication port COM may support wired or wireless communication. The wired communication may be, for example, controller area network (CAN) communication, the wireless communication may be, for example, ZigBee or Bluetooth communication, and the communication protocol is not limited to a particular type and includes any type of communication protocol supporting wired/wireless communication between the control unit 200 and the external device.

Although the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A current detection circuit for detecting an electric current of a battery pack, comprising:
   an insulating substrate;
   a first busbar and a second busbar disposed on a first surface of the insulating substrate;
   a shunt resistor disposed between the first busbar and the second busbar on the first surface, and electrically connected to the first busbar and the second busbar;
   a hall effect sensor disposed on a second surface of the insulating substrate, wherein the second surface is opposite the first surface; and
   a third busbar and a fourth busbar disposed on the first surface,
   wherein the first busbar is electrically connected to a first connection pin of a first switching device disposed on the second surface of the insulating substrate,
   wherein the third busbar is electrically connected to a second connection pin of the first switching device,
   wherein the second busbar is electrically connected to a third connection pin of a second switching device disposed on the second surface of the insulating substrate, and
   wherein the fourth busbar is electrically connected to a fourth connection pin of the second switching device.

2. The current detection circuit according to claim 1, wherein the hall effect sensor is disposed between the first switching device and the second switching device.

3. The current detection circuit according to claim 1, wherein the insulating substrate includes a first via hole, a second via hole, a third via hole and a fourth via hole, each of the via holes passing through the insulating substrate between the first surface and the second surface,
   wherein the first busbar and the first connection pin are electrically connected to each other through the first via hole,
   wherein the second busbar and the third connection pin are electrically connected to each other through the second via hole,
   wherein the third busbar and the second connection pin are electrically connected to each other through the third via hole, and
   wherein the fourth busbar and the fourth connection pin are electrically connected to each other through the fourth via hole.

4. The current detection circuit according to claim 1, wherein widthwise centers of each of the first busbar, the second busbar, the shunt resistor and the hall effect sensor are aligned with each other.

5. The current detection circuit according to claim 1, further comprising:
   a magnetic shield partially surrounding the hall effect sensor.

6. The current detection circuit according to claim 1, wherein a direction of a widthwise center of the shunt resistor is aligned with a direction of a widthwise center of the hall effect sensor.

7. The current detection circuit according to claim 1, wherein the insulating substrate includes:
   a first conductive pattern electrically connected to a control pin of the first switching device; and
   a second conductive pattern electrically connected to a control pin of the second switching device.

8. A battery management system comprising:
   the current detection circuit according to claim 1; and
   a control unit configured to receive a first current signal from the shunt resistor and a second current signal from the hall effect sensor.

9. The battery management system according to claim 8, wherein the control unit is configured to:
   determine whether the current detection circuit is faulty based on the first current signal and the second current signal, and
   output a diagnosis signal indicating a result of the determination.

10. A battery pack comprising the battery management system according to claim 8.

11. A current detection circuit for detecting an electric current of a battery pack, comprising:
   an insulating substrate;
   a first busbar and a second busbar disposed on a first surface of the insulating substrate;
   a shunt resistor disposed between the first busbar and the second busbar on the first surface, and electrically connected to the first busbar and the second busbar;
   a hall effect sensor disposed on a second surface of the insulating substrate, wherein the second surface is opposite the first surface; and
   a magnetic shield partially surrounding the hall effect sensor,
   wherein the insulating substrate further includes a first opening and a second opening, each opening passing through the insulating substrate between the first surface and the second surface, and
   wherein respective portions of the magnetic shield pass through the insulating substrate from the first surface to the second surface through the first opening and the second opening, respectively.

12. The current detection circuit according to claim 5, wherein the magnetic shield includes:
   a base; and
   a pair of legs bent from opposing sides of the base and extending so that the pair of legs face each other.

* * * * *